United States Patent [19]

Kushima et al.

[11] Patent Number: 4,503,597

[45] Date of Patent: Mar. 12, 1985

[54] METHOD OF FORMING A NUMBER OF SOLDER LAYERS ON A SEMICONDUCTOR WAFER

[75] Inventors: Tadao Kushima, Ibaraki; Masahiro Gooda, Hitachi; Tasao Soga, Hitachi; Toshitaka Yamamoto, Hitachi, all of Japan

[73] Assignee: Hitachi, Ltd., Tokyo, Japan

[21] Appl. No.: 464,379

[22] Filed: Feb. 7, 1983

[30] Foreign Application Priority Data

Feb. 8, 1982 [JP] Japan .................................. 57-17558

[51] Int. Cl.³ ............................................. H01L 21/00
[52] U.S. Cl. .................................... 29/569 R; 29/591; 219/85 R; 219/85 E; 219/85 M; 228/212; 357/68
[58] Field of Search ................. 29/580, 581, 588, 589, 29/591, 569; 357/65, 68; 219/85 R, 85 M, 85 E, 85 F, 121 LE, 121 LF, 129, 158, 162; 228/56 R, 212, 213; 427/88, 89, 90, 91, 355, 367, 369; 118/500; 164/47, 159, 284, 338.1

[56] References Cited

U.S. PATENT DOCUMENTS 3,106,014 10/1963 Brick et al. ................... 228/212 X
3,112,388 11/1963 Wiant ................................. 219/85 E

OTHER PUBLICATIONS

Koop et al., *IBM Tech. Disc. Bull.*, vol. 13, No. 8, Jan. 1971, "Etched Braze Preform Sheet".
Herdzik et al., *IBM Tech. Disc. Bull.*, vol. 22, No. 3, Aug. 1979, "Method to Change Solder Composition of Chip".

*Primary Examiner*—Brian E. Hearn
*Assistant Examiner*—David A. Hey
*Attorney, Agent, or Firm*—Antonelli, Terry & Wands

[57] ABSTRACT

A method of forming a number of discrete solder layers on a semiconductor wafer of a large area. A number of regions which are easy to be wetted with solder are formed on one of the major surfaces of the wafer. A solder foil is positioned on the one major surface and a plate-like jig including a plate and projections formed on one surface thereof is disposed on the solder foil with the projections facing the latter. By heating the stacked assembly at a sufficiently high temperature for the solder foil to be molten, a number of the discrete solder layers having a uniform thickness are formed on the semiconductor wafer.

26 Claims, 12 Drawing Figures

METHOD OF FORMING A NUMBER OF SOLDER LAYERS ON A SEMICONDUCTOR WAFER

The present invention relates to an improvement of a method of forming a number of solder layers on one or both major surfaces of a semiconductor wafer.

In fabrication of a semiconductor element of a small current capacity, it is generally adopted in practice that a single semiconductor wafer of a large area is first prepared in which a pn-junction is formed, which is followed by passivating treatment of the exposed portions of the pn-junction, provision of ohmic contacts and formation of solder layers on the ohmic contacts. Thereafter, the semiconductor wafer is divided into a number of semiconductor pellets from which the semiconductor elements are realized. This manufacturing method is certainly excellent in respect of the mass-productivity. There arise however problems in this manufacturing method in connection with the step of forming the solder layers.

As a method of forming a number of discrete solder layers on the semiconductor wafer, it has heretofore been widely adopted that a semiconductor wafer provided with the ohmic contacts is immersed in a molten solder bath. This method in which difference in wettability to solder between the semiconductor and the ohmic contacts is taken advantage of is certainly a simple and convenient process for allowing the solder layers to be formed only on the ohmic contacts. However, this method suffers drawbacks which will be mentioned below.

A drawback to be first mentioned is seen in the fact that the amount of deposited solder is uneven among the solder layers. The amount of solder deposited wettingly on the ohmic contacts will vary in dependence on an angle and a speed at which the semiconductor wafer is lifted or withdrawn upwardly from the molten solder bath as well as the temperature thereof. In the present state of the technical level, it is difficult to control the amount or quantity of solder deposited through wetting so that uniform thickness be attained for all the solder layers. A reduced quantity of the deposited solder will naturally result in a thin solder layer. In that case, when the pellet provided with such thin solder layer is assembled to a semiconductor device by attaching leads to the solder layers, significant stress is produced due to difference in thermal expansion between the semiconductor pellet and the lead attached to the solder layer, to thereby shorten the use life of the solder layer. On the contrary, deposition of solder in an excessive quantity results in formation of the solder layer of an increased thickness, increasing the heat resistance and electrical resistance of the solder layer, as the result of which thermal and electrical characteristics of the finished semiconductor device will inevitably be degraded. Further, in case a semiconductor device is to be constituted by a plurality of semiconductor elements disposed between rows of leads arrayed in opposition to each other with an equal distance between the leads in each row, which leads are attached to the respective semiconductor elements, unevenness in the thickness of the solder layers will involve unevenness among the individual semiconductor elements in respect to the contact area over which the lead is contacted to the solder layer, whereby the thermal and the electrical characteristics are made unbalanced among the semiconductor elements.

A second drawback resides in that the surface of the molten solder mass constituting the solder layer tends to be spherical under the surface tension. When the surface of the molten solder layer becomes spherical, the lead to be attached may be inclined or positionally mis-aligned relative to the ohmic contact, providing an obstacle to attaining the desired structure of lead attachment. This problem is particularly serious when a plurality of semiconductor devices disposed between rows of the leads are to be attached with the leads.

An object of the present invention is to provide a method of forming a number of discrete solder layers on a semiconductor wafer, in which the drawbacks of the prior art methods described above are eliminated.

Another object of the present invention is to provide a method of forming a plurality of discrete solder layers on a semiconductor wafer, which solder layers are uniform in thickness and present flat top surfaces, respectively.

A still further object of the present invention is to provide a method which is capable of forming a number of discrete solder layers on a semiconductor wafer having a uniform thickness and presenting flat top surfaces with an improved reproducibility.

In view of the objects mentioned above, a first feature of the method of forming discrete solder layers on a semiconductor wafer according to the invention resides in that those portions of one major surface of the semiconductor wafer having a large area on which the discrete solder layers are to be formed are rendered easier to be wetted with solder than the remaining portions, and a solder foil is disposed on the one major surface of the wafer to be subsequently heated. More specifically, those portions of the one major surface of the semiconductor wafer on which the solder layers are to be formed are provided with metal electrodes which can be ohmic-contacted to the semiconductor wafer and are easy to be wetted with solder, while at the remaining portions the surface of the semiconductor wafer is exposed as it is or alternatively coated with an insulation film. After the solder foil has been disposed on the semiconductor wafer, the stacked structure or assembly is heated. As the consequence, molten solder is gathered on each of the metal electrodes under surface tension, whereby a number of separated or discrete solder layers are formed on the semiconductor wafer. In conjunction with the first feature or aspect of the inventive method described above, the solder foil should preferably be realized in a net-like structure and disposed on the semiconductor wafer in such a manner that the center of each of meshes formed in the solder foil is located essentially at the center of an area defined by the adjacent metal electrodes among them, in order to assure the melting separation of the solder foil (i.e. separation of the solder foil into the discrete solder layers through melting of the former) in a satisfactory manner. In more concrete, when the metal electrodes of a same configuration are formed and disposed in a matrixlike array on the semiconductor wafer, the distance between any given meshes located adjacent to each other is so determined that each of the meshes lies among a given quartet of the adjacent metal electrodes. The solder foil thus prepared is disposed on the semiconductor wafer to be subsequently subjected to the heating process. In other words, it can be said that the solder foil prepared so as to meet the above geometrical or positional requirement is composed of solder foil portions provided in correspondence to the metal electrodes, respectively, and interconnecting portions or bridge portions for connecting or linking the solder foil portions to one another. The solder foil portion should preferably be of a slightly smaller area than that of the metal electrode so that solder material constituting the interconnection or bridge is also permitted to gather on the metal electrode when it is molten, to thereby assure the breakage of the interconnecting portion without fail. Further, it is preferred that the interconnecting bridge portion has a narrowed or constricted mid portion so that the breakage thereof through melting takes place at the well defined location, because the thickness of the solder layer as formed can then be made uniform more positively for all the metal electrodes.

According to a second feature of the present invention, the step of separating or fragmenting the solder foil disposed on the semiconductor wafer into the discrete solder layers through melting is carried out in such a situation that the discrete solder layers may have a uniform thickness and present respective flat top surfaces. To this end, a plate-like jig composed of a plate having a plurality of projections or protrusions which have a height equal to the thickness of the solder layer to be formed is disposed on the solder foil placed on the semiconductor wafer. The stacked assembly is subsequently heated to a melting temperature. The platelike jig may be made of a material which is difficult to be wetted with solder and capable of withstanding the melting temperature of the solder material. In most of practical applications, the discrete solder layers will be formed simultaneously on a number of semiconductor wafers at both major surfaces thereof through the melting separation process. In such case, a single plate-like jig provided with the projections on both surfaces may be used for both the overlying and the underlying semiconductor wafers.

According to a third feature of the solder layer forming method according to the present invention, the step of separating the solder foil disposed on the semiconductor wafer into the discrete solder layers through melting (i.e. the melting separation step or process) is carried out in non-oxidizing atmosphere. More specifically, the melting separation step is conducted in the atmosphere of an inert gas, a reducing gas or a gas mixture thereof. In particular, when the melting separation step is carried out in the atmosphere of a reducing gas, the wettability to solder as well as the surface tension can be enhanced to allow the melting separation process to be effected smoothly. Besides, the finished solder layers present pure and clear surfaces, facilitating attachment of leads, to a further advantage.

The present invention will be more apparent from the following detailed description taken in conjunction with the accompanying drawings, in which:

Figure 1A:
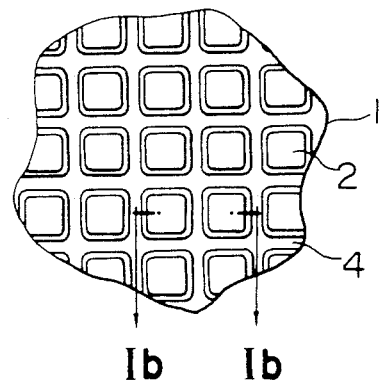
FIGS. 1a, 1b, 2, 3a, 3b, 4a, 4b, 4c and 5 are views for illustrating steps of a solder layer forming method according to a preferred embodiment of the invention.

Now, the method of forming discrete solder layers according to the present invention will be described in detail in conjunction with its preferred embodiments by referring to the drawings.

FIGS. 1 to 5 are views which illustrate steps involved in carrying out the method according to a preferred embodiment of the invention.

Figure 1B:
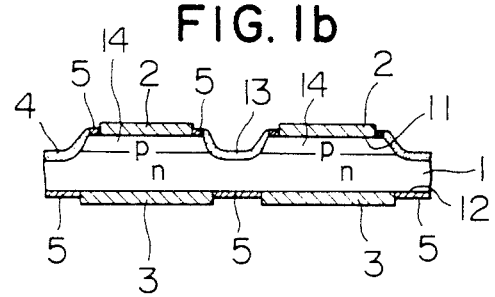

At steps illustrated in FIGS. 1a and 1b, a semiconductor wafer 1 of a large area in which a desired pn-junction is formed undergoes a treatment through which those portions of both major surfaces 11 and 12 of the semiconductor wafer 1 where solder layers are to be formed are rendered easy to be wetted with solder while the other portions being made difficult to be wetted with solder. To this end, a plurality of grooves 13 are formed in the one major surface 11 in such an array that the grooves 13 extend orthogonally in X- and Y-directions with the adjacent grooves being spaced at a substantially equal distance, whereby there are produced a large number of mesa-like portions 14 each of a square surface in a matrix-like array, being partitioned from one another by the surrounding grooves. On each of the surfaces of the mesa-like portions 14, a metal electrode formed of a material exhibiting high wettability to the solder such as, for example, Ni, an alloy of Cr—Ni—Ag or the like. Similar metal electrodes 3 are also formed on the other major surface 12 of the semiconductor wafer 1 at locations corresponding to the mesa-like portions 14 in opposition thereto, respectively. The surfaces of the grooves 13 are covered with a passivation film 4 such as a glass film. Further, the remaining portions of both the major surfaces are covered with a SiO$_2$-film 5. Since the glass film 4 as well as the SiO$_2$-film 5 is intrinsically poor in wettability to the solder, they are certainly effective in reducing the wettability to the solder at the portions covered with these films. It should however be noted that the inherent function of these films resides in passivating the active surfaces of the semiconductor surface. In other words, even when these portions of the semiconductor wafer are exposed as they are because of no passivation being required, the exposed surfaces can nevertheless be made difficult to be wetted with solder by virtue of the structure mentioned above.

Figure 2:
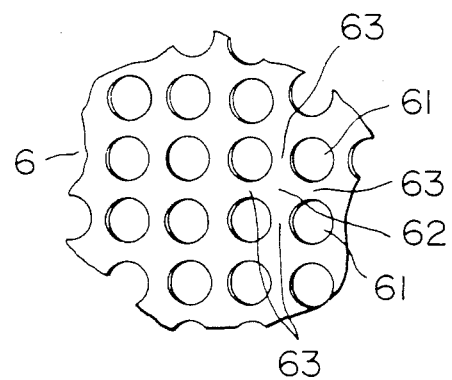

FIG. 2 illustrates a step for preparing a netlike solder foil 6 which has a uniform thickness and is provided with a number of circular or round meshes 61 formed and arrayed at the same pitch as the mesa-like portions 14 of the semiconductor wafer 1. On account of the presence of the meshes 61, the solder foil 6 may be considered to be constituted by a number of solder foil portions 62 arrayed in correspondence to the mesa-like portions 14 of the semiconductor wafer 1 and interconnecting portions or bridges 63 which connect the adjacent solder foil portions to one another. Each of the solder foil portions 62 is realized in an area smaller than that of the metal electrodes 2 and 3, while the interconnecting portion 63 is so formed as to present an intermediate portion of a reduced width as compared with the other portions thereof.

Figure 3A:
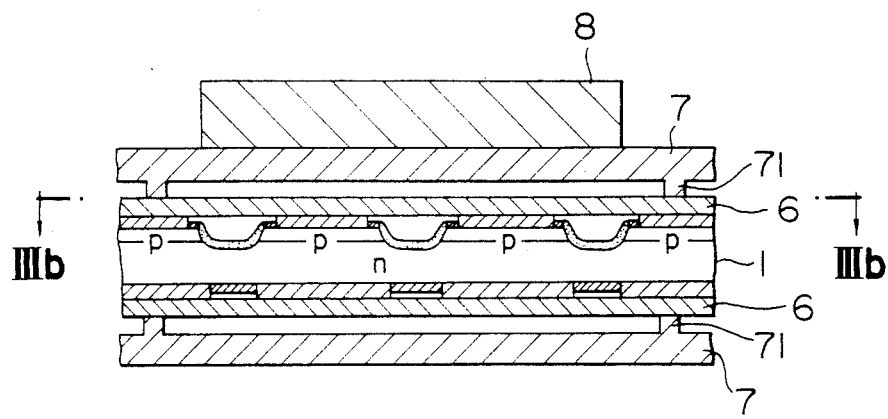
Figure 3B:
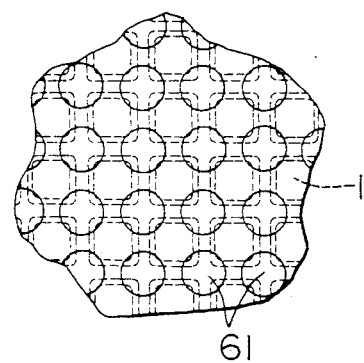

FIGS. 3a and 3b illustrate steps at which the solder foils 6 are positioned over both the major surfaces of the semiconductor wafer 1. In FIG. 3a, a reference numeral 7 denotes a jig plate provided with a predetermined number of protrusions 71 each of a predetermined height. The stacked or laminated structure in which the semiconductor wafer 1 sandwiched between two sheets of the solder foil 6 is disposed between a pair of the jig plates 7 which are so positioned that the respective projections 71 faces each other in alignment. Referring to FIG. 3b, the solder foils 6 are positioned on both the major surfaces of the semiconductor wafer 1, respectively, in such a disposition that the solder foil portions 62 coincide with the metal electrodes 2 and 3, respectively, while the meshes 61 coincide, respectively, with those areas each defined among a quartet of the metal electrodes located adjacent to one another. More specifically, the solder foil 6 is positioned on the one major surface 11 of the semiconductor wafer 1 so that the meshes 61 coincide with the intersections of the grooves 13, respectively, while on the other major surface 12, the solder foil 6 is disposed so that the meshes 61 lie at locations which correspond to the projections of the said intersections on the other major surface 12, respectively. In this connection, it should be noted that each of the meshes 61 is formed in such a size which allows the metal electrode (2; 3) to be partially exposed therethrough, when the solder foil 6 is disposed on the semiconductor wafer 1 in the manner described above. Each of the protrusions or projections 71 of the jig plate 7 has a height which is selected to be substantially equal to the thickness of the solder layer to be formed on the metal electrode (2; 3). The projections 71 are formed on the jig plate 7 at the positions which coincide with given ones of the metal electrodes (2; 3) or supporting studs formed previously on the semiconductor wafer 1. In FIG. 3a, a reference numeral 8 denotes a load applying plate 8 disposed on the jig plate 7 for the purpose of preventing the semiconductor wafer 1 from being bent at a melting separation step described below.

Figure 4A:
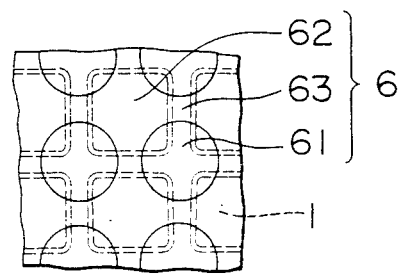
Figure 4B:
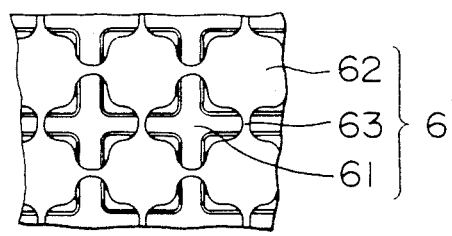
Figure 4C:
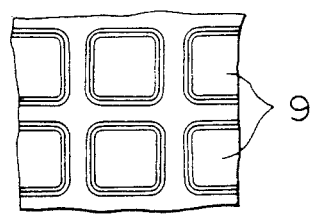
Figure 5:
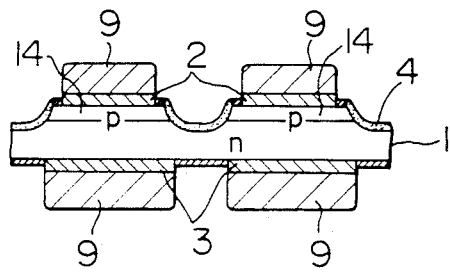

FIGS. 4a to 4c are views for illustrating a manner in which the so-called melting separation of the solder foil 6 proceeds at the melting separation step which is carried out by heating up the laminated or stacked structure shown in FIG. 3 to a sufficiently high temperature for the solder foil 6 to be completely molten. The temperature in question lies in the range from 320° C. to 450° C. when the solder being used is alloy of Pb-5%Sn-1.5%Ag. When the solder foil 6 of the initial configuration shown in FIG. 4a begins to be molten in the initial phase of this melting separation process, the solder foil portions 62 being molten tend to spread over the respective underlying metal electrodes 2 due to the wettability thereof, while the interconnecting portions 63 tend to gather on the metal electrode 2 under the attraction exerted by a surface tension, as the result of which the state illustrated in FIG. 4b prevails in the solder foil 6. As the melting further proceeds, the interconnecting portions 63 are broken to be heaped on the metal electrodes, while gathered masses of the solder material spread wettingly all over the whole top surfaces of the metal electrodes 2, whereby the state illustrated in FIG. 4c is ultimately attained. In this case, the molten solder gathering on the metal electrode tends to become spherical under the surface tension. This tendency is however suppressed by the jig plate 7. Thus, a solder layer 9 having a flat top surface is obtained, as is shown in FIG. 5. The melting separation process described above should be carried out in a non-oxidizing atmosphere and more preferably in a reducing atmosphere such as hydrogen gas atmosphere.

FIG. 5 shows the semiconductor wafer 1 provided with a number of the solder layers 9 formed on both the major surfaces through the steps elucidated above. The semiconductor wafer 1 thus finished is then cut along the grooves 13 with suitable means such as, for example, a laser beam into a number of semiconductor elements each of which is subsequently assembled to a semiconductor device after attachment of leads and air-tight sealing. Since such assembling process is irrelevant to the essence of the present invention, description thereof will be unnecessary.

Advantageous effects involved in the method of forming the solder layers according to the teaching of the invention will be mentioned below:

(1) By virtue of such provision that those portions of the major surfaces of the semiconductor wafer at which the solder layers are to be formed are rendered easily wettable with the molten solder material while the remaining portions being made difficult to be wetted, a number of the individual discrete solder layers can be realized through the single melting separation process merely by heating the solder foils disposed on the major surfaces of the semiconductor wafer. Assuming that the solder layers were connected to one another by the solder material to the contrary, the semiconductor pellets which are formed by mechanically cutting the semiconductor wafer provided with the interconnected solder layer would be inevitably polluted with the solder material at the cut faces, requiring thus troublesome and time consuming procedures for removing the pollution. The method of forming the discrete solder layers according to the preferred embodiment of the invention described above is immune to such difficulty.

(2) Because of solder foil is realized in the net-like configuration in which the shapes and array of the portions of the semiconductor wafer to be provided with the solder layers is taken into account, the separation of the single solder foil into a number of the discrete solder layers by melting the foil (i.e. through the melting separation) can be smoothly and positively effected.

(3) By virtue of such arrangement that the semiconductor foil of the net-like configuration includes a number of the solder foil portions positioned, respectively, on the metal electroces of the semiconductor wafer to be provided with the discrete solder layers, each portion having a slightly smaller area than that of the metal electrode, and the interconnecting bridges for linking the adjacent solder foil portions to one another, wherein each bridge is most reduced in width at the mid portion thereof, attraction of a relatively great strength is available for pulling or gathering the molten solder mass forming the interconnection onto the metal electrodes, whereby the melting separation of the solder foil into the individual discrete solder layer can be effected without fail. Further, since the breakage of the interconnecting bridge through the melting necessarily occurs at the narrowest portion thereof, the amount of the molten solder material heaped up on the metal electrodes can be spontaneously made uniform throughout all the discrete solder layers.

(4) Since the separation of the solder foil into the individual solder layers through the melting proceeds in the state in which the tendency of the molten solder material to become spherical under the surface tension is suppressed by the jig plate, the top surfaces of the solder layers can be flattened uniformly, involving no unevenness in level among the adjacent solder layers. Thus, the various problems arising in connection with the attachment of the leads to the semiconductor elements, as described hereinbefore, can be all disposed of in a satisfactory manner.

(5) Because the melting separation of the solder foil is carried out in the non-oxidizing atmosphere and more preferably in the reducing atmosphere, the melting separation can take place smoothly with the surface of the solder layer being simultaneously purified.

Figure 6A:
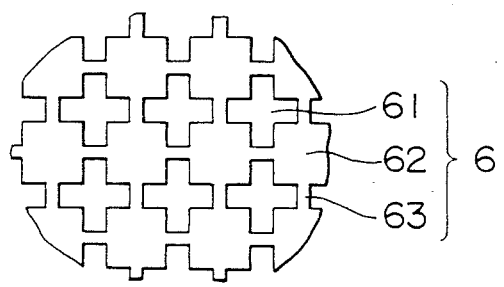
FIGS. 6a and 6b are plan views showing modifications of a solder foil which can be used in carrying out the method according to the invention.
Figure 6B:
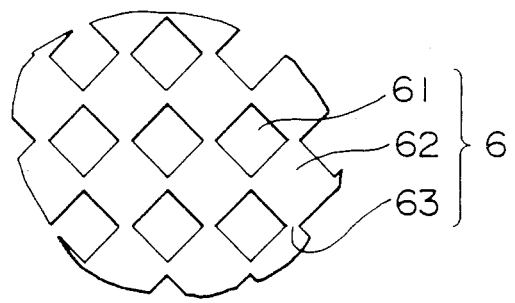

In the foregoing, the present invention has been described in conjunction with its preferred embodiment. The invention can moreover be carried out in various modified manners mentioned below:

As a first modification, FIGS. 6a and 6b show examples of the solder foil which may be used in carrying out the invention. In the case of the solder foil shown in FIG. 6a, the solder foil portion denoted by 62 is of a square shape like that of the metal electrode 2 (or 3). (The area of the former is however slightly smaller than the latter.) In this case, the interconnecting bridge 63 should preferably be imparted with a reduced width at the mid portion thereof. In the case of the solder foil illustrated in FIG. 6b, the mesh is realized in a rectangular shape. In this connection, it should be mentioned that the solder foil having no meshes also may be used, although not shown. In that case, however, a lot of time will be involved in the melting separation. Besides, there is a possibility that the solder foil might not be divided perfectly into the individual solder layers.

A second conceivable modification concerns the semiconductor wafer. For example, a semiconductor wafer having the grooves formed in both the major surfaces, a semiconductor wafer provided with no grooves at both the major surfaces, a semiconductor wafer in which the metal electrode is round and the like may be equally employed.

A third modification concerns the material of which the semiconductor wafer is made. The invention may be applied not only to the semiconductor wafer of silicon, but to those made of germanium, silicon carbide and a compound semiconductor, respectively.

Figure 7:
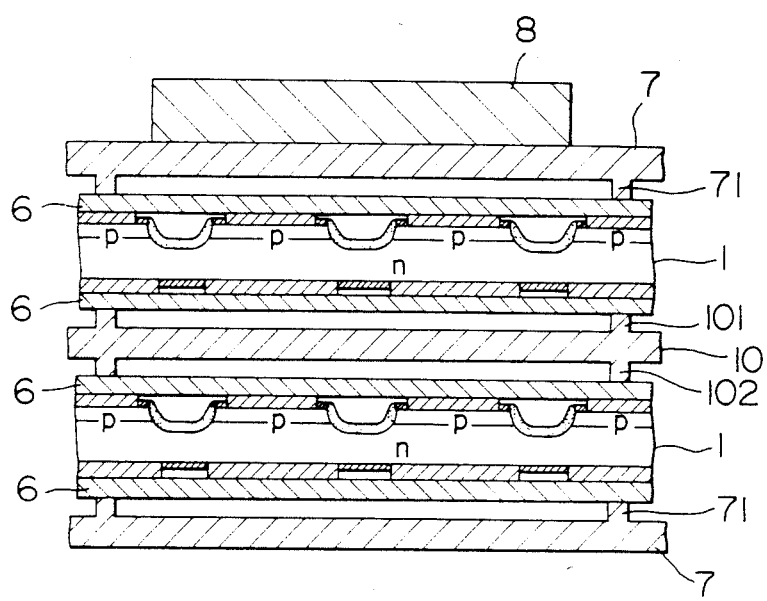
FIG. 7 shows in a schematic sectional view a version of the melting separation step involved in carrying out the method according to the invention.

A fourth possible modification concerns the step illustrated in FIG. 3a, in which it is assumed that the solder layers are to be formed on the single semi-conductor wafer. In case the solder layers are to be formed simultaneously on a plurality of semiconductor wafers, a desired number of the laminated structure illustrated in FIG. 3a may be stacked on one another. Alternatively, a plurality of the semiconductor wafers 1 may be stacked between the top and the bottom jig plates 7, wherein jig plates 10 each having protrusions 101 and 102 formed at both surfaces and the solder foils 6 are interposed between the adjacent semiconductor wafers 1, as illustrated in FIG. 7.

Next, a numerical example of the invention will be mentioned below.

A disc-like silicon wafer of 100 mm in diameter was prepared. After formation of a pn-junction in this wafer, a number of the grooves each of 200 $\mu$m in width and 65 $\mu$m in depth were formed in one of the major surfaces of the wafer at a pitch of 1.9 mm so that the grooves extend orthogonally in X- and Y-directions, as is shown in FIG. 1a, to thereby form a corresponding number of the mesa-like portions of 1.7 mm square in a juxtaposed array. The grooves were coated with a glass film of 5 $\mu$m in thickness. Metal electrodes of Cr—Ni—Ag each of 1.45 mm square and 2.2 $\mu$m thick were formed on the surface of the mesa-like portions, respectively. The remaining surface portion of each metal electrode is coated with a SiO$_2$-film in thickness of 1 $\mu$m. Metal electrodes of Cr—Ni—Ag each of 1.45 mm square and 2.2 $\mu$m thick were formed on the other major surface of the silicon wafer at positions corresponding to the mesa-like portions. The remaining portions of the other major surface was coated with a SiO$_2$-film in thickness of 1 $\mu$m. A solder disc of Pb—Ag—Sn having a thickness of 100 $\mu$m and a diameter equal to that of the wafer was prepared. A number of through-holes each of 1.4 mm in diameter were formed in the solder disc in X- and Y-directions in a juxtaposed array at an inter-center pitch of 1.9 mm, to thereby form the so-called solder foil. Jig plates each composed of a disc having a thickness of 2.5 mm and a diameter equal to that of the wafer and a desired number (nine in this illustrated case) of projections of 100 $\mu$m in height formed on one or both surfaces of the disc were prepared. Five silicon warfers were stacked with the solder foils and the jig plates being interposed in a laminated structure shown in FIG. 7. A load plate of 1.5 Kg was disposed on the top jig plate. When the laminated or stacked structure was heated in a furnace at a temperature of 400° C., the solder foil is molten and separated into the individual discrete solder layers formed on the metal electrodes, respectively. All the discrete solder layers formed on the metal electrodes were 100 $\mu$m thick and presented flat surfaces of substantially same shape as those formed on the other major surface of the wafer.

We claim:

1. A method of forming a number of discrete solder layers on a semiconductor wafer, comprising steps of:
    forming at least on one major surface of said semiconductor wafer a number of first regions easily wettable with solder and second regions which are difficultly wettable with solder, said second regions separating said first regions from one another;
    disposing a solder foil on said one major surface of said semiconductor wafer;
    disposing on said solder foil positioned on said semiconductor wafer a plate-like jig including a plate and projections formed at least on one surface of said plate in such a manner that said projections face said solder foil, said projections having a height substantially identical to the thickness of said solder layers; and
    heating a stacked structure including said semiconductor wafer, said solder foil and said plate-like jig in a non-oxidizing atmosphere to a sufficiently high temperature for said solder foil to be molten, whereby solder layers having a uniform thickness and a flat surface adjacent said plate-like jig are formed.

2. A method of forming a number of discrete solder layers on a semiconductor wafer according to claim 1, wherein said solder foil is of a net-like structure.

3. A method of forming a number of discrete solder layers on a semiconductor wafer according to claim 1, wherein said solder foil has apertures located at those portions which correspond, respectively, to said second regions of said semiconductor wafer which are difficult to be wetted with solder, each of said aperture extending to each of said first regions easily wettable with solder, said solder foil thus presenting a net-like structure as a whole.

4. A method of forming a number of discrete solder layers on a semiconductor wafer according to claim 3, wherein the apertures extend over the first regions easily wettable with solder to an extent that the solder foil material covers a smaller area than that of the first regions so that the bridging portion of the net-like structure can gather on said first regions when the solder foil is molten.

5. A method of forming a number of discrete solder layers on a semiconductor wafer according to claim 1, wherein said first regions of said semiconductor wafer which are easy to be wetted with solder are formed by depositing a metal film which can be contacted to said semiconductor wafer and are easily wettable with solder, while said second regions difficultly wettable with solder are formed through deposition of an insulation film.

6. A method of forming a number of discrete solder layers on a semiconductor wafer according to claim 1, wherein said plate-like jig is made of a material which is difficult to be wetted by the solder.

7. A method of forming a number of discrete solder layers on a semiconductor wafer according to claim 6, wherein said plate-like jig is made of a material that is capable of withstanding the melting temperature of the solder material.

8. A method of forming a number of discrete solder layers on a semiconductor wafer according to claim 1, wherein said non-oxidizing atmosphere is an atmosphere of a reducing gas.

9. A method of forming a number of discrete solder layers on a semiconductor wafer, comprising steps of:
    forming on a pair of opposite major surfaces of said semiconductor wafer a number of first regions easily wettable with solder and a number of second regions difficultly wettable with solder in a juxtaposed array, wherein said second regions separate said first regions from one another;
    disposing solder foils on both the major surfaces, respectively, of said semiconductor wafer;
    disposing on each of said solder foils positioned on said semiconductor wafer a plate-like jig including a plate and projections formed at least on one surface of said plate in such a manner that said projections face said solder foil, said projections having a height substantially identical to the thickness of said solder layers; and
    heating a stacked structure including said semiconductor wafer, said solder foils and said plate-like jigs in a non-oxidizing atmosphere to a sufficiently high temperature for said solder foils to be molten, whereby solder layers having a uniform thickness and a flat surface adjacent said plate-like jig are formed.

10. A method of forming a number of discrete solder layers on a semiconductor wafer according to claim 9, wherein said solder foils are of a net-like structure.

11. A method of forming a number of discrete solder layers on a semiconductor wafer according to claim 9, wherein said solder foil has apertures located at those portions which correspond, respectively, to said second regions of said semiconductor wafer which are difficult to be wetted with solder, each of said aperture extending to each of said first regions easily wettable with solder, said solder foil thus presenting a net-like structure as a whole.

12. A method of forming a number of discrete solder layers on a semiconductor wafer according to claim 9, wherein said first regions of said semiconductor wafer which are easy to be wetted with solder are formed by depositing a metal film which can be contacted to said semiconductor wafer and are easily wettable with solder, while said second regions difficultly wettable with solder are formed through deposition of an insulation film.

13. A method of forming a number of discrete solder layers on a semiconductor wafer according to claim 9, wherein said plate-like jig is made of a material which is difficult to be wetted by the solder.

14. A method of forming a number of discrete solder layers on a semiconductor wafer according to claim 13, wherein said plate-like jig is made of a material that is capable of withstanding the melting temperature of the solder material.

15. A method of forming a number of discrete solder layers on a semiconductor wafer according to claim 9, wherein the steps of forming on a pair of opposite major surfaces of said semiconductor wafer a number of first regions and a number of second regions, and disposing solder foils, is performed on a plurality of semiconductor wafers; the plate-like jigs include two end plate-like jigs, each including said plate and said projections on at least one surface of said plate, and intermediate plate-like jigs, each intermediate plate-like jig adapted to be sandwiched between two semiconductor wafers having the solder foils disposed on the major surfaces thereof and including said plate and said projections on the two surfaces of the plate; and said stacked structure includes the two end plate-like jigs at the respective ends, a plurality of the semiconductor wafers with the solder foils disposed on both the major surfaces thereof, and intermediate plate-like jigs between adjacent semiconductor wafers.

16. A method of forming a number of discrete solder layers on a semiconductor wafer, comprising steps of:
    forming on at least one of major surfaces of said semiconductor wafer a number of metal electrodes having a subtantially same shape in orthogonal X- and Y-directions with a predetermined distance between adjacent ones of said electrodes in a juxtaposed array, to thereby form first regions which are easy to be wetted with solder and second regions which are difficult to be wetted with solder;
    disposing a solder foil on said one major surface of said semiconductor wafer;
    disposing on said solder foil positioned on said semiconductor wafer a plate-like jig including a plate and projections formed at least on one surface of said plate in such a manner that said projections face said solder foil, said projections having a height substantially identical to the thickness of said solder layers; and
    heating a stacked structure including said semiconductor wafer, said solder foil and said plate-like jig in a non-oxidizing atmosphere to a sufficiently high temperature for said solder foil to be molten, whereby solder layers having a uniform thickness and a flat surface adjacent said plate-like jig are formed.

17. A method of forming a number of discrete solder layers on a semiconductor wafer according to claim 16, wherein said solder foil has apertures located at those locations which correspond, respectively, to portions lying among the adjacent metal electrodes, each of said apertures extending to each of said metal electrodes, said solder foil thus presenting a net-like structure as a whole.

18. A method of forming a number of discrete solder layers on a semiconductor wafer according to claim 17, wherein said metal electrode is of a substantially square shape, while said aperture formed in said solder foil is of a circular shape.

19. A method of forming a number of discrete solder layers on a semiconductor wafer according to claim 16, wherein said plate-like jig is made of a material which is difficult to be wetted by the solder.

20. A method of forming a number of discrete solder layers on a semiconductor wafer according to claim 19, wherein said plate-like jig is made of a material that is capable of withstanding the melting temperature of the solder material.

21. A method of forming a number of discrete solder layers on a semiconductor wafer, comprising steps of:
forming on one of major surfaces of said semiconductor wafer a number of first metal electrodes having a substantially same shape and positioned in orthogonal X- and Y-directions with a predetermined distance between adjacent ones of said electrodes in a juxtaposed array, to thereby form regions which are easy to be wetted with solder and regions which are difficult to be wetted with solder, and forming on the other major surface of said wafer a number of second juxtaposed metal electrodes of a substantially same form in correspondence with said first metal electrode, to thereby provide said other major surface with regions easily wettable with solder and regions difficulty wettable with solder;
disposing solder foils on both the major surfaces, respectively, of said semiconductor wafer;
disposing on each of said solder foils positioned on said semiconductor wafer a plate-like jig including a plate and projections formed at least on one surface of said plate in such a manner that said projections face said solder foil, said projections having a height substantially identical to the thickness of said solder layers; and
heating a stacked structure including said semiconductor wafer, said solder foils and said plate-like jigs is non-oxidizing atmosphere to a sufficiently high temperature for said solder foils to be molten, whereby solder layers having a uniform thickness and a flat surface adjacent said plate-like jig are formed.

22. A method of forming a number of discrete solder layers on a semiconductor wafer according to claim 21, wherein said solder foils have apertures located at those locations which correspond, respectively, to portions lying among the adjacent metal electrodes, each of said apertures extending to each of said metal electrodes, said solder foil thus presenting a net-like structure as a whole.

23. A method of forming a number of discrete solder layers on a semiconductor wafer according to claim 22, wherein said metal electrode is of a substantially square shape, while said aperture formed in said solder foil is of a circular shape.

24. A method of forming a number of discrete solder layers on a semiconductor wafer according to claim 22, wherein each of those portions of said solder foil which correspond to locations lying among the adjacent metal electrodes has a mid portion which is narrowest in width.

25. A method of forming a number of discrete solder layers on a semiconductor wafer according to claim 21, wherein said plate-like jig is made of a material which is difficult to be wetted by the solder.

26. A method of forming a number of discrete solder layers on a semiconductor wafer according to claim 25, wherein said plate-like jig is made of a material that is capable of withstanding the melting temperature of the solder material.

* * * * *